(12) United States Patent
Hui et al.

(10) Patent No.: US 9,840,651 B2
(45) Date of Patent: Dec. 12, 2017

(54) FLOWABLE COMPOSITIONS WITH LOW TEMPERATURE CURING TO FORM THERMALLY CONDUCTIVE PATHWAYS IN ELECTRONICS TYPE APPLICATIONS AND METHODS RELATING THERETO

(71) Applicant: E I DU PONT DE NEMOURS AND COMPANY, Wilmington, DE (US)

(72) Inventors: Dave Hui, Bristol (GB); John McKean Oleksyn, Bristol (GB); Jason Kenneth Parsons, Bristol (GB); Gareth Michael Fuge, Bristol (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 150 days.

(21) Appl. No.: 14/791,575

(22) Filed: Jul. 6, 2015

(65) Prior Publication Data

US 2016/0009976 A1 Jan. 14, 2016

Related U.S. Application Data

(60) Provisional application No. 62/023,215, filed on Jul. 11, 2014.

(51) Int. Cl.
*H01B 1/22* (2006.01)
*C09D 5/24* (2006.01)
(Continued)

(52) U.S. Cl.
CPC .............. *C09K 5/14* (2013.01); *C09D 5/24* (2013.01); *C09D 11/10* (2013.01); *C09D 11/52* (2013.01);
(Continued)

(58) Field of Classification Search
CPC ... H01B 1/00; H01B 1/16; H01B 1/22; C09D 5/24
See application file for complete search history.

(56) References Cited

U.S. PATENT DOCUMENTS

2009/0186219 A1  7/2009  Inaba
2011/0068011 A1* 3/2011  Crumpton ............... H01B 1/22
                                                                          205/80
(Continued)

FOREIGN PATENT DOCUMENTS

CN    103413591 A   11/2013
EP    1093327 A2    4/2001
(Continued)

OTHER PUBLICATIONS

International Search Report and Written Opinion dated September 15, 2015 for International Patent Application PCT/US2015/038810.

*Primary Examiner* — Mark Kopec

(57) ABSTRACT

A flowable, (e.g., screen printable, stencil printable and/or dispensable) thermally conductive paste is disclosed and provide low temperature curing or firing. The pastes are useful in forming thermally conductive pathways for electronic type applications, such as, providing thermal conduction between a semiconductor chip and its associate semiconductor chip packaging (e.g. power electronic applications), which can be useful in power converters, electrical power steering modules, car head lights (LEDs), solar cells, printed circuit boards (PCBs), plasma display panels (PDPs), and the like. The pastes have a combination of conductive flakes and particles in a minimal amount of carrier fluid and carrier resin to provide advantageous deposition and heat melding properties.

8 Claims, 1 Drawing Sheet

(51) Int. Cl.
*C09K 5/14* (2006.01)
*C09J 9/02* (2006.01)
*H01B 1/02* (2006.01)
*C09J 11/04* (2006.01)
*C09D 11/52* (2014.01)
*C09D 11/10* (2014.01)
*H05K 1/09* (2006.01)
*C08K 3/08* (2006.01)
*C08K 7/00* (2006.01)

(52) U.S. Cl.
CPC ............. *C09J 9/02* (2013.01); *C09J 11/04* (2013.01); *H01B 1/02* (2013.01); *H01B 1/22* (2013.01); *C08K 3/08* (2013.01); *C08K 7/00* (2013.01); *C08K 2003/0806* (2013.01); *C08K 2201/001* (2013.01); *H05K 1/097* (2013.01); *H05K 2201/0245* (2013.01)

(56) References Cited

U.S. PATENT DOCUMENTS

2013/0069014 A1    3/2013  Lee et al.
2014/0126113 A1*  5/2014  Ogiwara .................. H01B 1/22
                                                  361/523

FOREIGN PATENT DOCUMENTS

JP          11-66956     *   3/1999
WO      2009157727 A2    12/2009
WO      2012129554 A2     9/2012

* cited by examiner

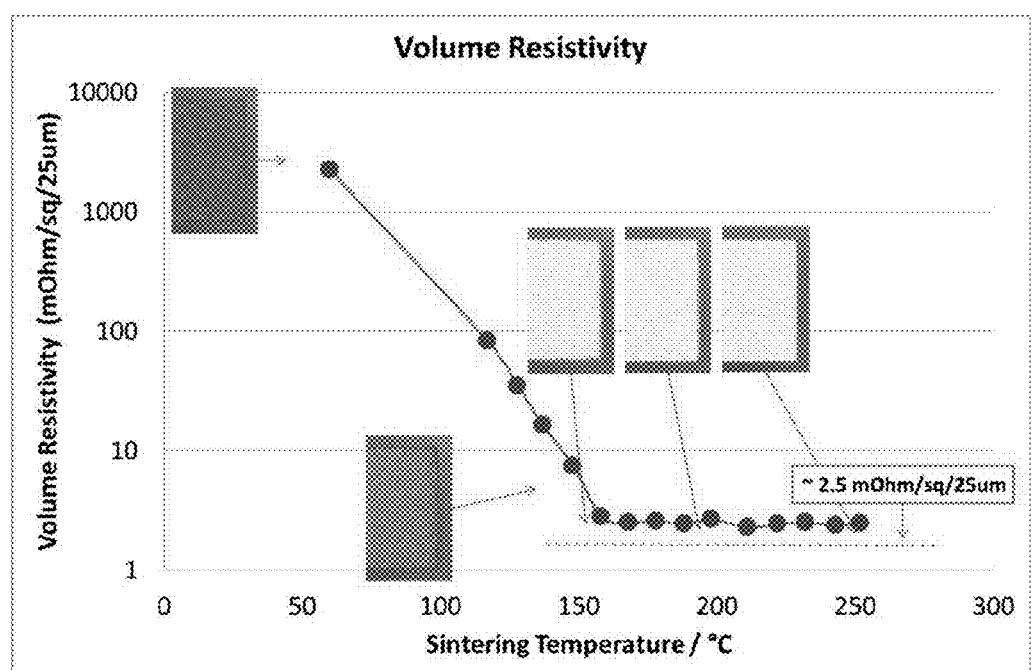

FLOWABLE COMPOSITIONS WITH LOW TEMPERATURE CURING TO FORM THERMALLY CONDUCTIVE PATHWAYS IN ELECTRONICS TYPE APPLICATIONS AND METHODS RELATING THERETO

FIELD OF THE INVENTION

The field of the invention is directed to flowable, (e.g., screen printable, stencil printable and/or dispensable) thermally conductive pastes. More specifically, the thermally conductive paste compositions of the present disclosure provide low temperature curing or firing, and are useful in forming thermally conductive pathways for electronic type applications, such as, providing thermal conduction between a semiconductor chip and its associate semiconductor chip packaging (e.g. power electronic applications), which can be useful in power converters, electrical power steering modules, car head lights (LEDs), solar cells, printed circuit boards (PCBs), plasma display panels (PDPs), and the like.

BACKGROUND OF THE INVENTION

Pastes are commonly used for creating conductive pathways for printed circuit boards (PCBs), radio-frequency identification devices (RFID), touch panels, plasma display panels (PDPs), solar cells or the like. The electronics industry is increasingly demanding higher performing conductive pastes that can be fired at lower temperatures.

US patent application 20130069014 A1 by Lee, et al. and assigned to Samsung Electro-Mechanics Co., Ltd is directed to conductive pastes which forego expensive silver as the conductive component, and instead using less expensive conductive materials, such as copper. A need exists in the industry for conductive pastes that have the performance of silver, but at a cost that is highly competitive with copper or other cheaper conductive materials.

SUMMARY OF THE INVENTION

The present disclosure is directed to a flowable composition, e.g., a paste, containing: i. a flowable carrier agent, such as an organic solvent; ii. a resin, such as an organic binder, e.g. polyester, polyacrylic acid, ethyl cellulose and similar type resin; and iii. a blend of conductive flakes and conductive particles. The flowable carrier agent together with the resin are together less than 10, 8, 7, 6, 5, 4, 3, 2, 1, or 0.5 wt % of the entire flowable composition. The conductive flakes together with the conductive particles are together greater than 90 weight percent of the entire flowable composition. In one embodiment, the conductive flakes, on average, are greater than a micron in at least one dimension. In another embodiment, the conductive particles, on average, are less than a micron in all dimensions. In one embodiment, the conductive flakes and conductive particles are metallic. In one embodiment, the flowable carrier agent is an organic solvent with a boiling point less than 160° C. In one embodiment, the conductive flakes and conductive particles are packed together to a packing density greater than 65, 70, 75, 80, 85, 90, 92, 93 or 95% of the density of the conductive particles and conductive flakes. The density of the conductive particles and conductive flakes is intended to mean the weight of the conductive particles and conductive flakes divided by the volume of water (at standard temperature and pressure) that would be displaced by the conductive particle and conductive flakes.

In one embodiment the flowable composition is a conductive paste containing: an organic solvent with a boiling point less than 200° C. 190, 180, 170, 165, 160, 155 or 150° C., an organic resin, and a blend of conductive flakes and conductive particles, where the conductive flakes and conductive particles comprise at least 1 weight percent and up to 100 weight percent silver. In such an embodiment, the solvent together with the organic resin are together less than 0.05 wt % to 10 wt % of the entire conductive paste composition. Also in this embodiment, the conductive flakes together with the conductive particles are together greater than or equal to 90 weight percent of the entire conductive paste. The conductive flakes in this embodiment, on average, are greater than a micron in at least one dimension and the conductive particles, on average, are less than a micron in all dimensions. The conductive flakes and particles are packed together to a packing density greater than 75% of the density of the conductive particles and conductive flakes.

In one embodiment, the conductive flakes and conductive particles comprise zero weight percent silver and comprise at least 50 weight percent of a conductive metal other than silver.

BRIEF DESCRIPTION OF THE DRAWINGS

FIG. 1 illustrates the volume resistivity, as a function of the sintering temperature.

DETAILED DESCRIPTION OF THE PREFERRED EMBODIMENTS

The present disclosure is directed to the discovery that a particular combination of conductive components having optimal shapes and composition in an optimal ratio can be transported in a paste or other flowable composition and then solidified by heat to provide advantageous conductive component packing. The flowable material can be applied as needed and then heated to provide useful thermally conductive pathways. In one embodiment the flowable material is a paste. The pastes of the present disclosure comprise relatively low amounts of solvent or other carrier agent. Depending upon the particular formulation selected, the paste can be fired at a low temperature, generally less than 350° C., 200° C., 190° C., 180° C., 175° C., 170° C., 165° C., 160° C., 155° C., 150° C., 145° C., 140° C., 135° C., 130° C., or 125° C. The resulting thermally conductive material has shown to have excellent thermal and electrical properties and also advantageous substrate adhesion. The resulting thermally conductive material is particularly useful as a thermally conductive pathway to reliably act (with sufficient substrate adhesion and also sufficient structural integrity) as a thermal bridge between a semiconductor chip and the semiconductor chip packaging to which the chip is attached.

Conductive Components

The shapes and ratio of shapes of the silver conductive filler in the paste are optimized, thus enabling the formation of a thermally conductive path or electrode exhibiting excellent electrical properties, and in some embodiments, even after receiving low temperature firing at 160° C. or less. The silver flake has been found to be favorable in terms of increasing conductivity because the contact area between the flake and particles is greater than if only particles were present. The flake component also tends to increase the thixotropic index (TI) of the paste thereby providing advantageous flow properties when applying the paste. If the size of the flake powder is less than 1 micron, the advantages of the flake tend to diminish. In some embodiments, if the size of the flake exceeds 10 microns, then dispersability in the paste may decrease, and printability may deteriorate depending upon the printing technology selected. The packing density may also decrease and affect both the thermal and electrical conductivity.

In the present invention, the particle shaped silver filler tends to have high dispersibility and will tend to fill the empty spaces between the silver flake, thereby increasing the metal filling rate of the paste. When the filling rate is increased, inner spaces may decrease after firing, and shrinkage may also be prevented, thus obtaining high thermal and electrical conductivity.

In the present invention, silver particles less than 100 nanometers in all dimensions can be advantageous and tend to promote fusion of the silver filler with the application of hear and can thereby lower the firing temperature necessary to create the thermally conductive pathway. The nano powder can increase viscosity which can be advantageous when printing or otherwise applying the material.

Furthermore, the surface of any of the conductive fillers may be coated with one or more dispersing agents selected from the group consisting of fatty acid-, amine-, alcohol-, thiol- and polymer-based dispersants.

The conductive components of the present disclosure include: i. conductive flakes that, on average, are greater than a micron in at least one dimension; and ii. conductive particles that are substantially spherical, where substantially spherical is intended to mean having an aspect ratio of from about 1:1 to about 1:1.5, whereas flake is intended to mean materials having an aspect ratio greater than 1:1.5. In one embodiment, the conductive particles have all dimensions on average that are less than a micron and greater than 100 nanometers (hereafter, "micro-particles). In another embodiment, the conductive particle are multi-modal with a portion of the particles being micro-particles and a portion having all dimensions less than 100 nanometers (hereafter, "nano-particles"). In one embodiment, 1, 2, 5, 10, 15, 20, 25, 30, 35, 40, or 50 weight percent of the conductive particles are nano-particles based upon total weight of the conductive components. In one embodiment, the amount of micro-particles is in a range between and optionally including any two of the following weight percentages (based upon the total weight of the conductive components): 25, 30, 35, 40, 45, 50, 55, 60, 65, 70, 75, 80, 85, and 90 weight percent. In one embodiment, the amount of conductive flake is in a range between and optionally including any two of the following weight percentages (based upon the total weight of the conductive components): 5, 7, 10, 15, 20, 25, 30, 35, 40, 45, 50 55, 60, 65, and 70 weight percent.

In one embodiment, some or all of the conductive components comprise a surface having a total or partial coating, where the coating comprises (or alternatively is derived from) fatty acid, amine, alcohol, thiol or a polymer based dispersant. For example, the fatty acid-based dispersant may include but is not limited to linear or branched $C_6$-$C_{22}$ saturated fatty acids or unsaturated fatty acids, which may be used alone or in combinations of two or more, and the amine-based dispersant may include but is not limited to linear or branched $C_6$-$C_{22}$ aliphatic amines, which may be used alone or in combinations of two or more. Also, the alcohol-based dispersant may include but is not limited to higher alcohol sulfuric acid ester, alkanol amide, glycerin, sorbitan and sorbitan ester, fatty acid diethanol amine, etc., and the thiol-based dispersant may include but is not limited to ethanethiol, methanethiol, propanethiol, butanethiol, mercaptoethanol, etc. The polymer-based dispersant may include but is not limited to polyvinylpyrrolidone, polyvinylbutyral, carboxymethylcellulose, and/or polyacrylic acid.

Binder Resin

In addition to the conductive components, the flowable compositions of the present disclosure also include a binder resin, such as, a polyester binder, a cellulose based binder, a melamine based binder or a cycloaliphatic based binder. Examples of cellulose binders include: ethyl cellulose, methyl cellulose, propyl cellulose, nitro cellulose, acetic acid cellulose, propionic acid cellulose, hydroxyethyl cellulose, hydroxypropyl cellulose, and hydroxyethylhydroxypropyl cellulose and the like. Examples of melamine based binders include: methylated melamine, methylated imino melamine, butylated melamine, butylated imino melamine, isobutylated melamine, methyl-butyl mixed melamine, hexamethoxymethyl melamine and urea melamine resin. In some embodiments, the melamine resin may cause self-condensation and thermal curing in the temperature range of 100-200° C. without the use of an additional curing agent, and may accelerate the packing of the silver filler during firing thus increasing thermal and electrical properties. Other useful binder resins include: acrylic binders, such as, acrylic binder is one or more selected from the group consisting of polymethylmethacrylate, ethylhexylmethacrylate, cyclohexylmethacrylate, and butylacrylate. In one embodiment, the binder resin is present in a weight percentage (based upon the total weight of the flowable composition) between and optionally including any two of the following: 0.01, 0.02, 0.05, 0.07, 0.1, 0.2, 0.3, 0.5, 0.75, 1, 2, 3, 4, 5, 6, 7, 8, 9, and 10 weight percent.

In some embodiments the cellulose-based binder is combined with the malmine-based binder, whereby the cellulose-based binder imparts thixotropy to the paste to facilitate the printing process and the melamine binder aids in low temperature firing. In some embodiments the acrylic binder can also be added to the cellulose and/or melamine binder to increase adhesivity of the final material.

Solvent

Organic solvents useful in accordance with the present invention include:

i. alcohols, such as, n-butanol, terpineol, and dihydroterpineol;

ii. diols, such as, ethylene glycol, propylene glycol, diethylene glycol, triethylene glycol and hexylene glycol;

iii. ether alcohols, such as, butoxyethanol, propoxypropanol and butyldiglycol;

iv. ethers such as ethylene glycol di-$C_1$-$C_6$-alkyl ethers, propylene glycol di-$C_1$-$C_6$-alkyl ethers, diethylene glycol di-$C_1$-$C_6$-alkyl ethers, dipropylene glycol di-$C_1$-$C_6$-alkyl ethers and tetrahydrofuran;

v. ketones, such as, acetone, methyl ethyl ketone, methyl propyl ketone, methyl isobutyl ketone, methyl amyl ketone, methyl isoamyl ketone, diethyl ketone, diisobutyl ketone, cyclohexanone, isophorone, 2,4-pentanedione and methoxy hexanone;

vi. esters or ether esters, such as, butyl carbitol, dihydroterpineol acetate, ethyl carbitol acetate, butyl carbitol acetate, ethyl ethoxypropionate, methyl glycol acetate, ethyl glycol acetate, butyl glycol acetate, butyl diglycol acetate, methoxypropyl acetate, ethoxypropyl acetate, methoxybutyl acetate, methyl acetate, ethyl acetate, propyl acetate, butyl acetate, isobutyl acetate, the pentyl acetate isomers, hexyl actetate, heptyl acetate, ethylhexyl acetate, methyl propionate, ethyl propionate, propyl propionate, butyl propionate, pentyl propionate, butyl butyrate, diethyl malonate, dimethyl adipate, dimethyl glutarate, dimethyl succinate, ethylene glycol diacetate, propylene glycol diacetate, dibutyl phthalate and dibutyl sebacate; terpenes, like alpha- or beta-terpineol; hydrocarbons like kerosene, or any combination thereof.

Depending upon the particular embodiment chosen, the solvent is present in an amount less than or equal to any of the following: 10, 8, 7, 6, 5, 4, 3, 2, 1, or 0.5 wt % based upon the total weight of the paste.

Optional Ingredients

Optional ingredients in accordance with the present disclosure include plasticizers (such as dioctylphthalate), thickeners (such as higher fatty acid, aliphatic amine salt or alkyl phosphoric acid ester), dispersants, thixotropic agents (such as, silica, bentonite, calcium carbonate, wax or polyethylene acetate), and defoaming agents (such as polysiloxane or silicone). Such optional ingredients can be used alone or in combination.

Methods

The compositions of the present disclosure composition may be printed using a process, such as screen printing, stencil printing, dispenser printing or the like. Furthermore, the composition thus printed may be fired in the temperature range of 120-350° C., depending upon the particular embodiment selected.

EXAMPLES

The following examples are set forth to illustrate but are not to be construed as limiting the present invention.

Production and Testing of Conductive Metal Inks, General Procedure

A ethyl cellulose resin (from Ashland, Aqualon® EC) with molecular weight less than or equal to 140000 was dissolved in texanol (from Eastman, approx. 99% purity) by heating up to 90° C. to form a viscous liquid medium. To this medium a blend of silver flake (from DuPont, with diameter 50% equal to 2 micron) and silver powders (from Ames Goldsmith, 7000-24 and 7000-35) were added and the resulting material was mixed using a gyratory mixer. The conductive flakes together with the conductive particles are together greater than 90 weight percent of the entire flowable composition. In those cases where the mixture of ethyl cellulose resin, silver powder and texanol did not total 100 pbm the balance was made up by addition of texanol. Then, using a triple roll mill, the mixture was roll milled to achieve a well dispersed paste (determined by use of a Hegman gauge). This paste was stencil printed as a 10×10 mm square onto a clean alumina substrate and subsequently dried in a static oven preset at 250° C. for one hour.

The electrical resistance, as shown in FIG. 1, of the dried print was measured by using a 4-wire probe, from which the resistivity of the print was calculated (in μΩ·cm).

Table 1 summarizes the composition of the inks made and the test results obtained.

| Example | Silver powder blend Type/d50 (um) | Ethyl cellulose Type | Resistivity (μΩ · cm) |
|---|---|---|---|
| 1 | Spherical/0.3 | A | 5.8 |
| 2 | Spherical/0.1 | A | 5.2 |
| 3 | Spherical/Flake/0.6 | A | 5.4 |

-continued

| Example | Silver powder blend Type/d50 (um) | Ethyl cellulose Type | Resistivity (μΩ · cm) |
|---|---|---|---|
| 5 | Spherical/Flake/0.8 | B | 5.0 |
| 7 | Flake | B | 9.0 |

Note:
Ethyl cellulose resin A and B contains standard ethoxyl substitution: 48.0-49.5%. Both A and B resin have degree of substitution of ethoxyl groups per anhydroglucose unit between 2.46 to 2.58.
Ethyl cellulose A: ethyl cellulose having a weight-average molar mass of 140000, ethoxyl substitution percentage between 48-49.5.
Ethyl cellulose B: ethyl cellulose having a weight-average molar mass less than 65000, ethoxyl substitution percentage between 48-49.5.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as failing within the scope of the present invention.

What is claimed is:

1. A flowable composition comprising:
   a. a flowable carrier agent;
   b. a resin; and
   c. a blend of conductive flakes and conductive particles, wherein: i. the flowable carrier agent together with the resin are together less than or equal to 15 wt % of the entire flowable composition, ii. the boiling point of the flowable carrier agent is in a range of 160-350 degree C., iii. the conductive flakes together with the conductive particles are together greater than or equal to 85 weight percent of the entire flowable composition, iv. the conductive particles are substantially spherical and have a mean particle diameter in a range of 0.01-0.1 micron, v. the blend of conductive metal flakes and conductive particles have a metal content of 98 weight % or higher, and the resin is at least one of a polyester binder, a cellulose based binder, a melamine based binder or a cycloaliphatic based binder.

2. A flowable composition in accordance with claim 1, wherein the conductive flakes, on average, are greater than a micron in at least one dimension.

3. A flowable composition in accordance with claim 1, wherein the conductive flakes and conductive particles comprise silver.

4. A flowable composition in accordance with claim 1, wherein the conductive flakes and conductive particles are packed together to a packing density greater than 60% of the density of the conductive particles and conductive flakes.

5. A flowable composition in accordance with claim 1, wherein the conductive flakes have a size that is greater than 1 micron and less than 10 microns.

6. A flowable composition comprising:
   a. a solvent;
   b. an organic resin;
   c. a blend of conductive flakes and substantially spherical conductive particles, wherein the conductive flakes and conductive particles comprise silver, and the conductive particles comprise a microparticle portion and a nanoparticle portion, the nanoparticle portion being particles having all dimensions between 0.01 and 0.1 microns that comprise 10-50 weight percent of the total weight of the conductive flakes and particles, and wherein said microparticle portion comprises particles that have all dimensions that are less than a μm and greater than 0.1 μm on average;

wherein the solvent together with the organic resin are together less than 10 wt % of the entire flowable composition, wherein the organic resin is at least one of a polyester binder, a cellulose based binder, a melamine based binder or a cycloaliphatic based binder, and wherein the conductive flakes together with the conductive particles are together greater than 90 weight percent of the entire flowable composition.

7. A flowable composition in accordance with claim 6, wherein the conductive flakes have a size that is greater than 1 micron and less than 10 microns.

8. A flowable composition comprising:
 a. a flowable carrier agent;
 b. a resin; and
 c. a blend of conductive flakes and conductive particles, wherein: i. the flowable carrier agent together with the resin are together less than or equal to 15 wt % of the entire flowable composition, ii. the boiling point of the flowable carrier agent is below 160 degree C., iii. the conductive flakes together with the conductive particles are together greater than or equal to 85 weight percent of the entire flowable composition, iv. the conductive particles are substantially spherical and have a mean particle diameter in a range of 0.01-0.1 micron, v. the blend of conductive metal flakes and conductive particles have a metal content of 98 weight % or higher, and the resin is at least one of a polyester binder, a cellulose based binder, a melamine based binder or a cycloaliphatic based binder.

* * * * *